(12) United States Patent
Grivna

(10) Patent No.: US 10,121,765 B2
(45) Date of Patent: Nov. 6, 2018

(54) SEMICONDUCTOR DEVICE AND METHOD OF FORMING WLCSP

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/446,182

(22) Filed: Mar. 1, 2017

(65) Prior Publication Data

US 2018/0254259 A1    Sep. 6, 2018

(51) Int. Cl.
*H01L 23/00*    (2006.01)
*H01L 21/56*    (2006.01)
(Continued)

(52) U.S. Cl.
CPC ............ *H01L 24/96* (2013.01); *H01L 21/561* (2013.01); *H01L 21/6836* (2013.01); *H01L 21/78* (2013.01); *H01L 23/3114* (2013.01); *H01L 24/05* (2013.01); *H01L 24/13* (2013.01); *H01L 2221/68327* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01);
(Continued)

(58) Field of Classification Search
CPC ... H01L 21/304; H01L 21/78; H01L 33/0095; H01L 2221/68327; H01L 2221/68336; H01L 2221/68331; H01L 21/3043; H01L 24/10; H01L 2224/10; H01L 24/94; H01L 24/96
See application file for complete search history.

(56) References Cited

U.S. PATENT DOCUMENTS 6,338,980 B1    1/2002    Satoh
7,776,649 B1    8/2010    Fan
(Continued)

OTHER PUBLICATIONS

Aditya Kumar et al., "Wafer Level Embedding Technology for 3D Wafer Level Embedded Package," Electronic Components and Technology Conference, IEEE, 2009, 9 pages.

*Primary Examiner* — Sonya D. McCall-Shepard
(74) *Attorney, Agent, or Firm* — IPTechLaw

(57) ABSTRACT

A semiconductor substrate contains a plurality of semiconductor die with a saw street between the semiconductor die. A plurality of bumps is formed over a first surface of the semiconductor die. An insulating layer is formed over the first surface of the semiconductor die between the bumps. A portion of a second surface of the semiconductor die is removed and a conductive layer is formed over the remaining second surface. The semiconductor substrate is disposed on a dicing tape, the semiconductor substrate is singulated through the saw street while maintaining position of the semiconductor die, and the dicing tape is expanded to impart movement of the semiconductor die and increase a space between the semiconductor die. An encapsulant is deposited over the semiconductor die and into the space between the semiconductor die. A channel is formed through the encapsulant between the semiconductor die to separate the semiconductor die.

19 Claims, 14 Drawing Sheets

(51) Int. Cl.
*H01L 21/78* (2006.01)
*H01L 21/683* (2006.01)
*H01L 23/31* (2006.01)

(52) U.S. Cl.
CPC ............ *H01L 2224/05147* (2013.01); *H01L 2224/05155* (2013.01); *H01L 2224/05166* (2013.01); *H01L 2224/05184* (2013.01); *H01L 2224/13026* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2924/014* (2013.01)

(56) References Cited

U.S. PATENT DOCUMENTS

| | | |
|---|---|---|
| 2001/0016400 A1 | 8/2001 | Lee |
| 2002/0025667 A1 | 2/2002 | Farnworth |
| 2003/0140514 A1* | 7/2003 | Fu .......................... H01L 22/34 33/645 |
| 2005/0255686 A1* | 11/2005 | Yamano ................. H01L 21/56 438/618 |
| 2007/0123001 A1 | 5/2007 | Reis |
| 2011/0045638 A1 | 2/2011 | Takamatsu et al. |
| 2014/0110842 A1 | 4/2014 | Zenz et al. |
| 2016/0276306 A1 | 9/2016 | Kamphuis et al. |

* cited by examiner

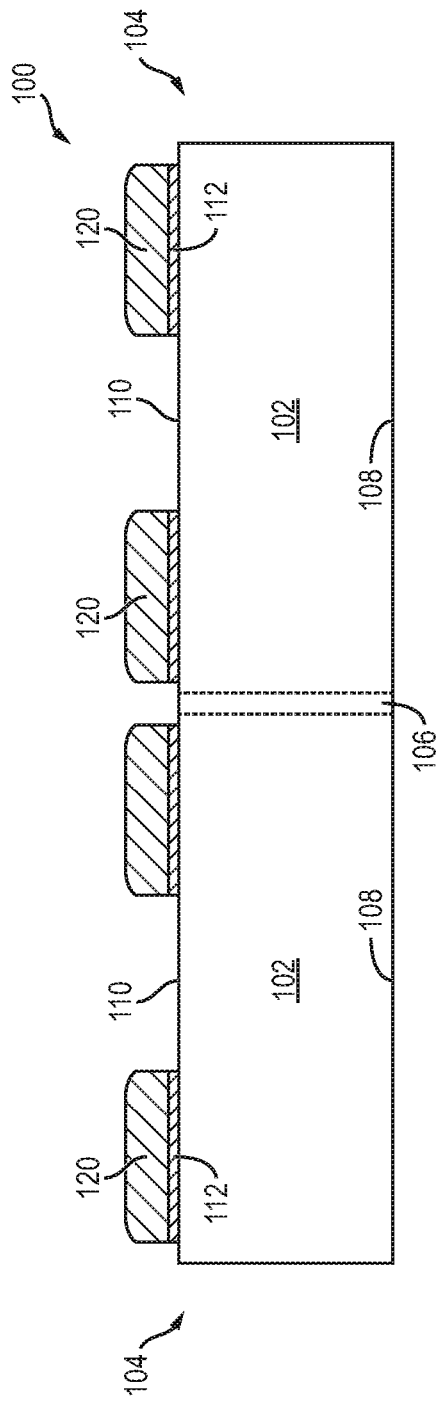
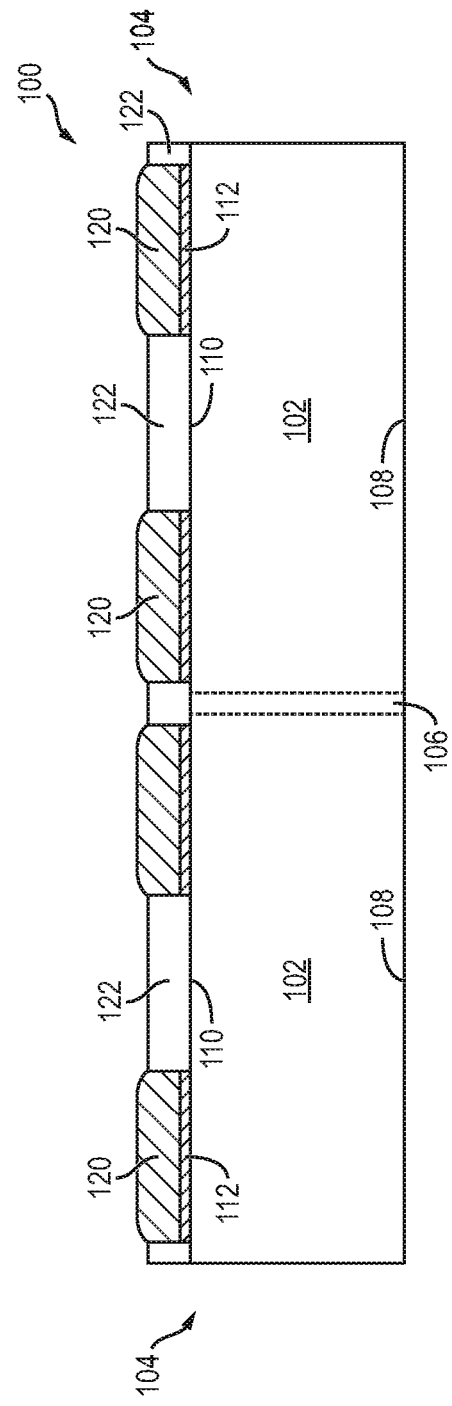
FIG. 2a
FIG. 2b

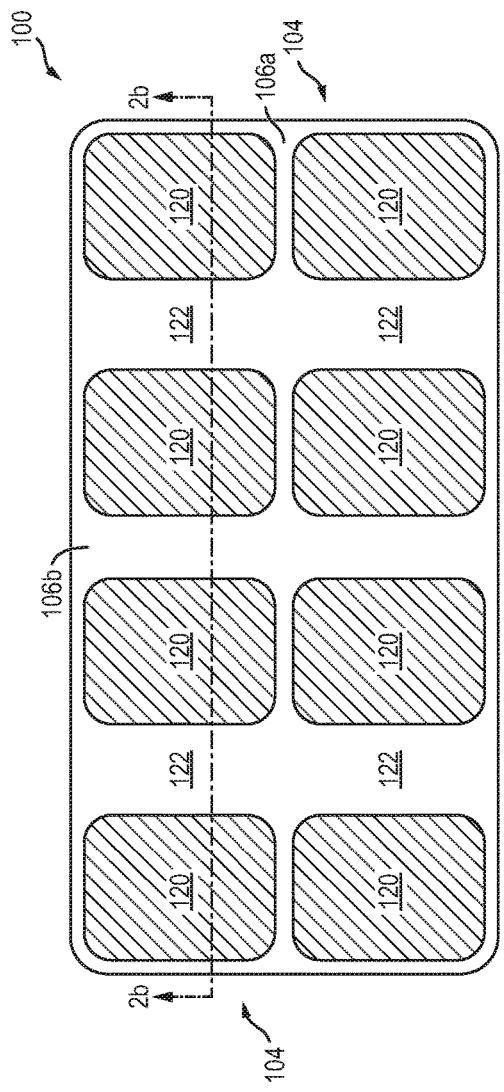
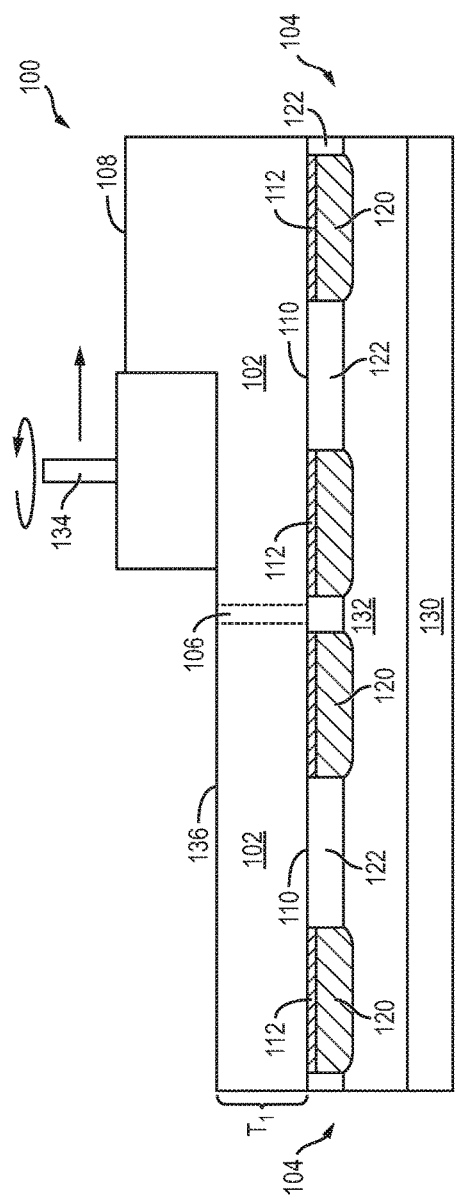
FIG. 2c
FIG. 2d

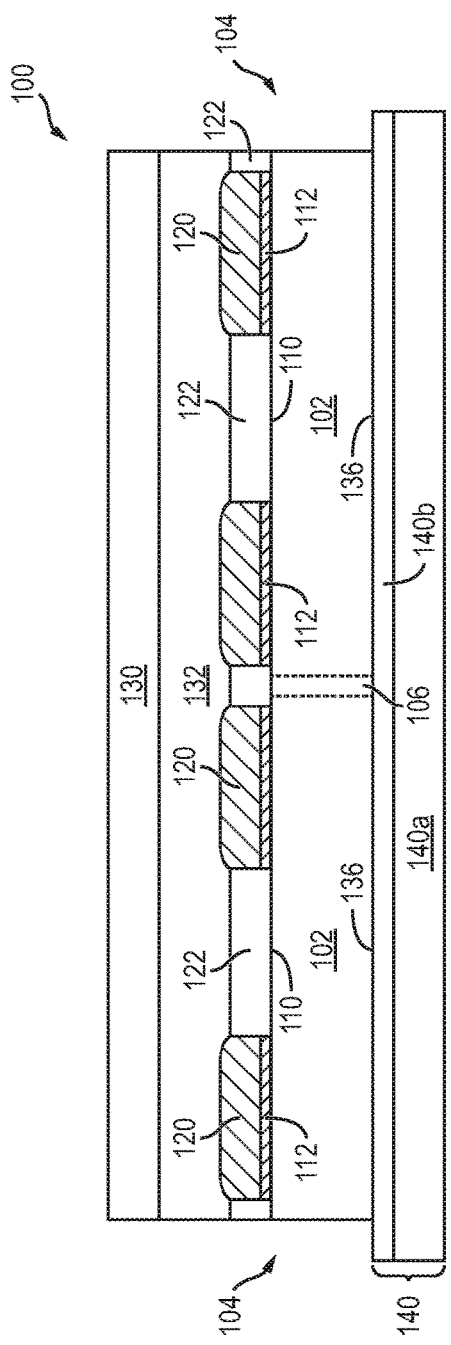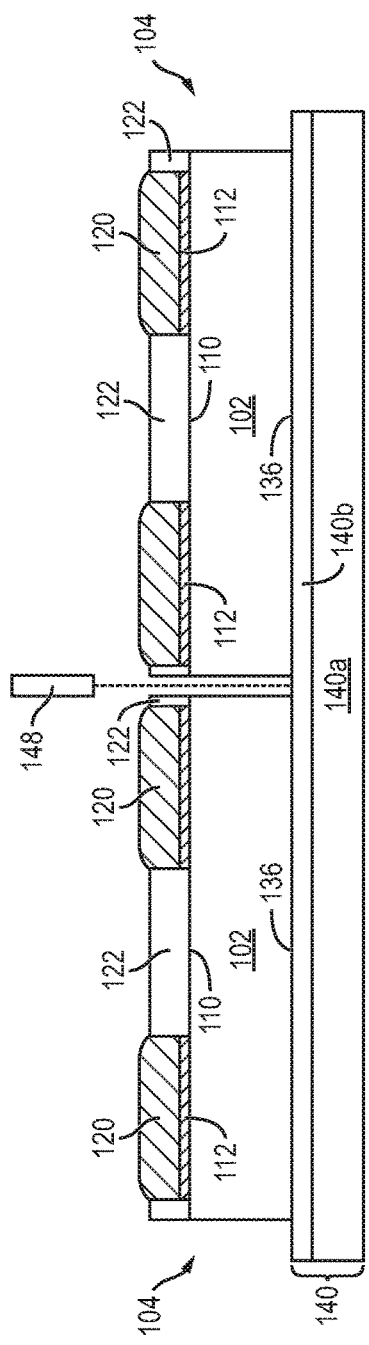

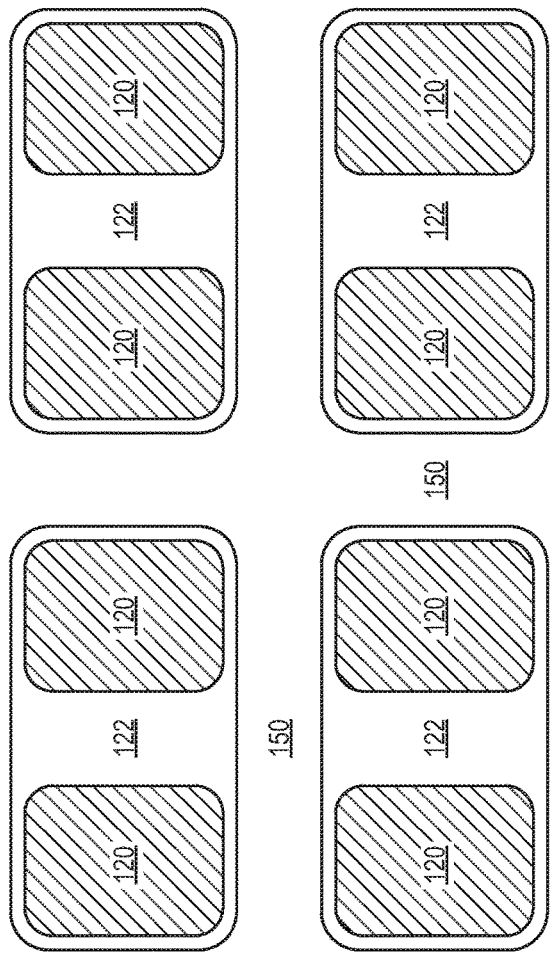
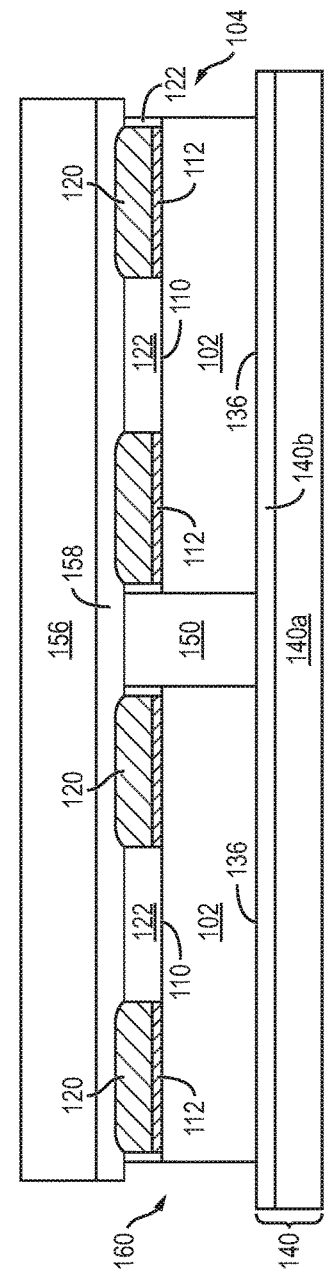
FIG. 2h
FIG. 2i

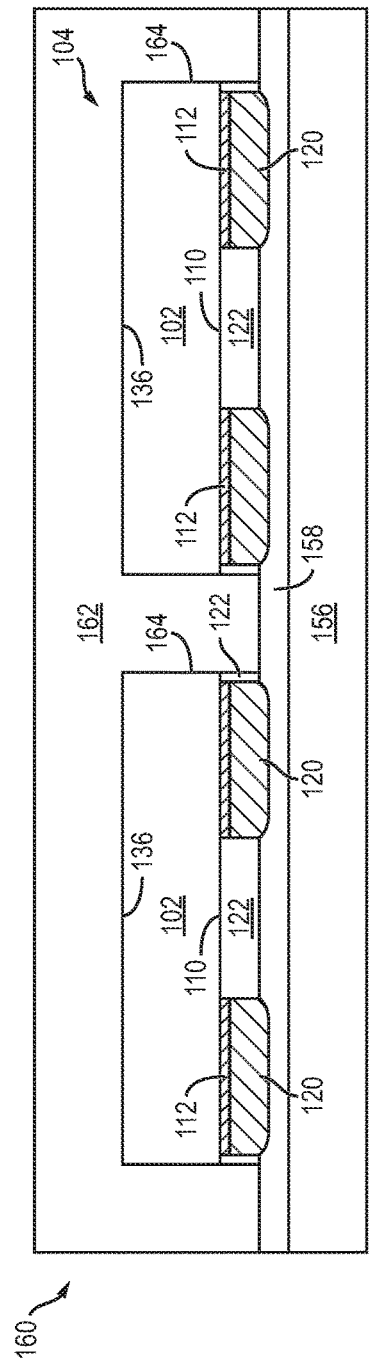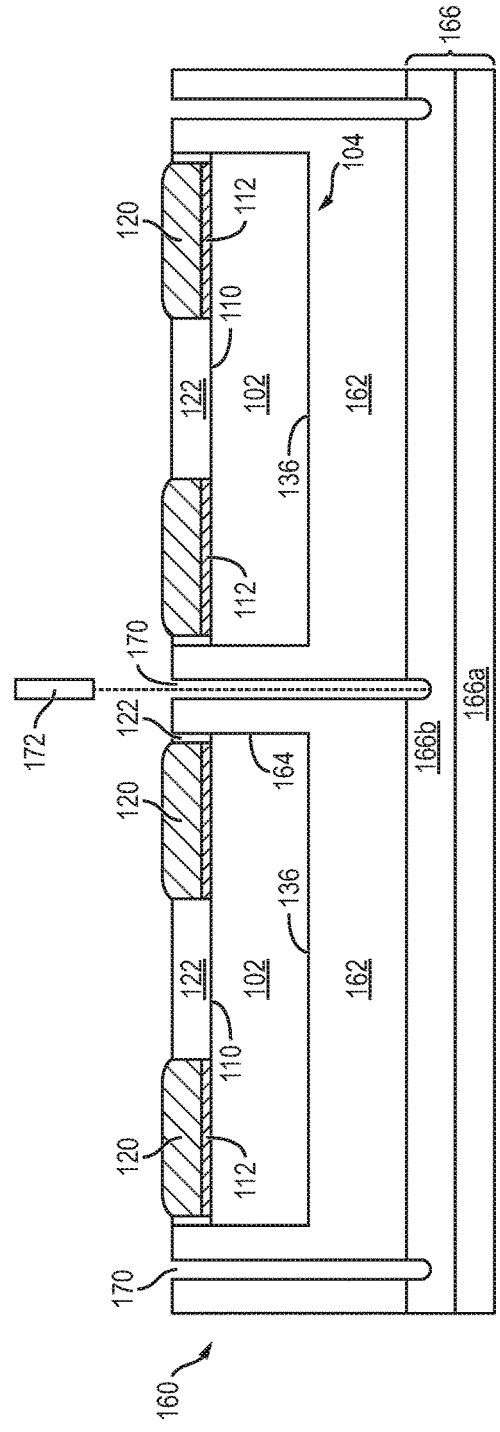

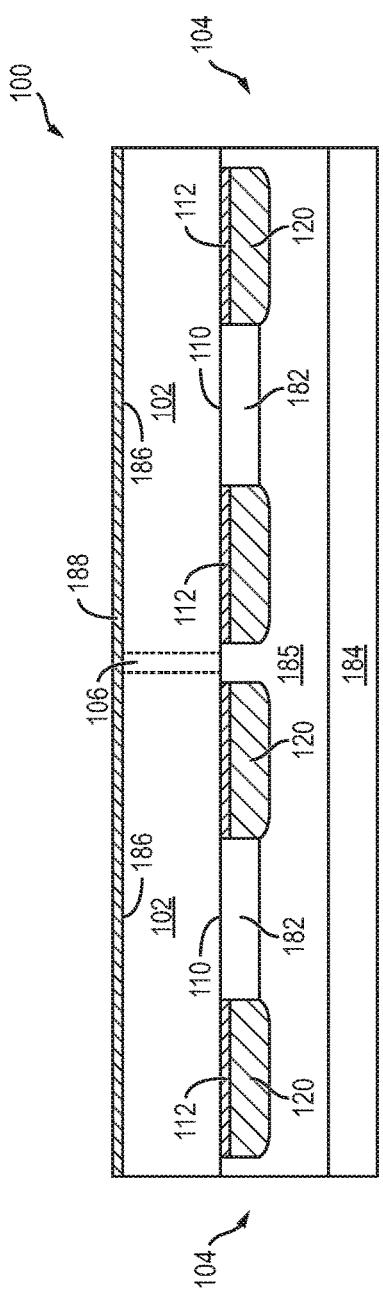
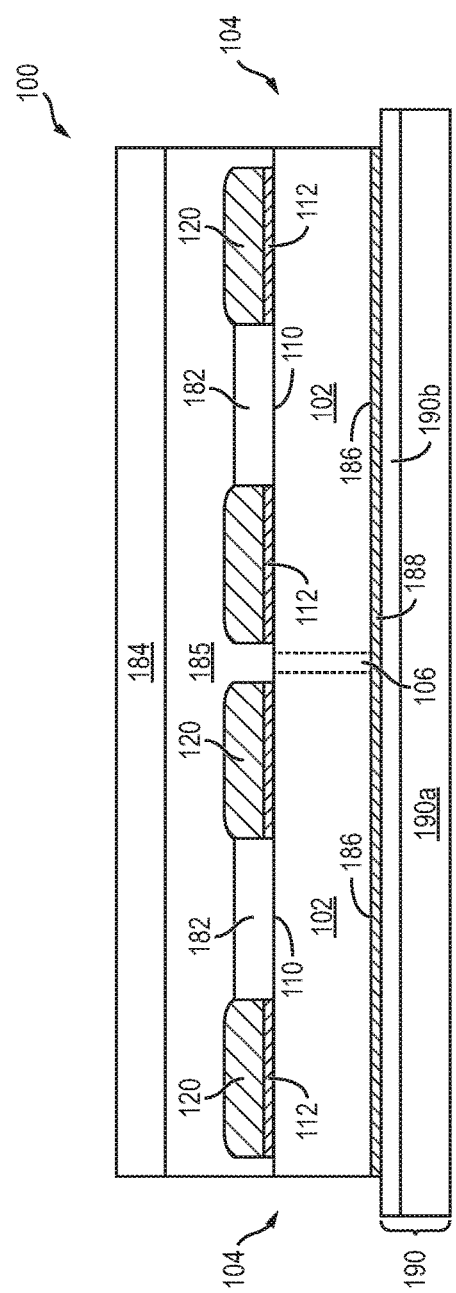

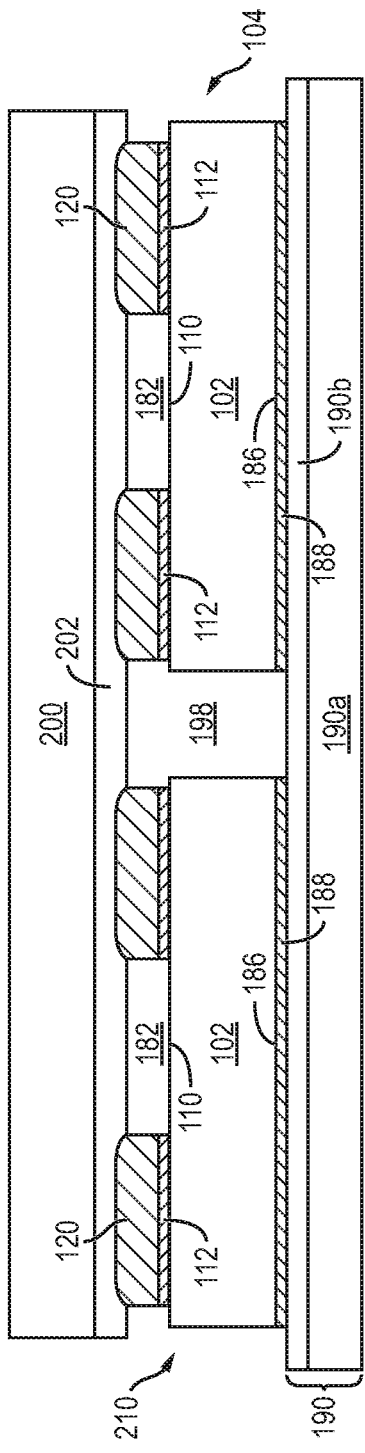
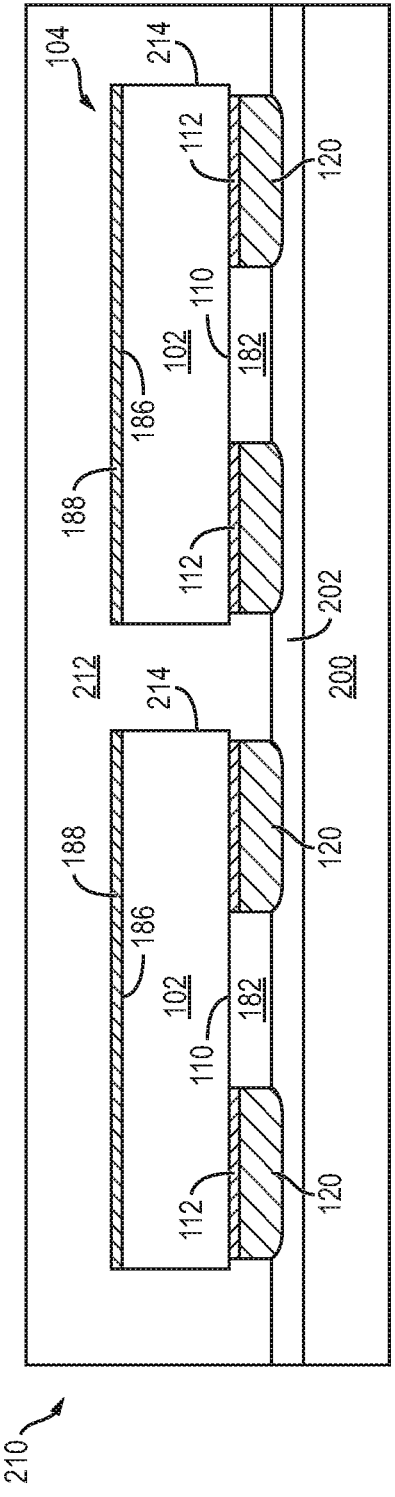

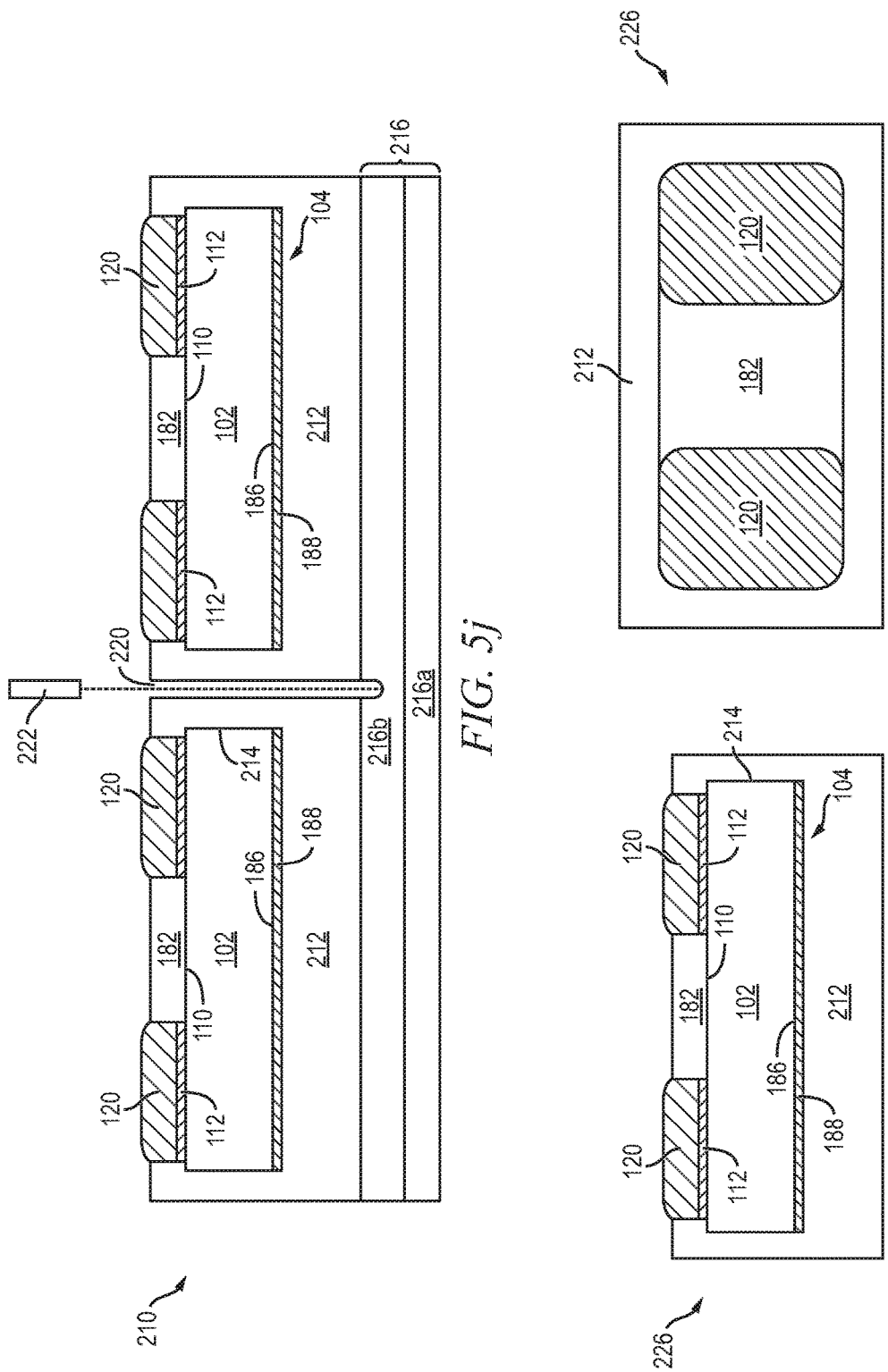

SEMICONDUCTOR DEVICE AND METHOD OF FORMING WLCSP

FIELD OF THE INVENTION

The present invention relates in general to semiconductor devices and, more particularly, to a semiconductor device and method of forming a wafer level chip scale package (WLCSP).

BACKGROUND

A semiconductor wafer or substrate can be made with a variety of base substrate materials, such as silicon (Si), germanium, aluminum nitride (AlN), gallium arsenide (GaAs), gallium nitride (GaN), aluminum gallium nitride over gallium nitride (AlGaN/GaN), indium phosphide, silicon carbide (SiC), or other bulk material for structural support. A plurality of semiconductor die is formed on the wafer separated by a non-active, inter-die substrate area or saw street. The saw street provides cutting areas to singulate the semiconductor wafer into individual semiconductor die.

In some cases, the semiconductor die are singulated from the semiconductor wafer and then individually packaged for electrical interconnect and encapsulation for environmental isolation. For small, common technology semiconductor die, such as a small signal diode, the die-level semiconductor packaging cost is often significantly greater than the cost of the die.

To reduce packaging cost, the semiconductor die can be packaged while in wafer form, e.g., in a wafer level chip scale package (WLCSP). Once in package form, the semiconductor die are separated from the wafer. WLCSP provides lower cost, reduces package size, and enhances thermal conduction characteristics. In WLCSP, the spacing between adjacent semiconductor die must be sufficiently large to perform the packaging operations, e.g., encapsulation and electrical interconnect while leaving sufficient scribe line width for singulation of the packaged die.

In one known double-encapsulation WLCSP process, a plurality of bumps is formed on the active surface of the semiconductor die while in wafer form. A channel or trench is cut partially into the bulk substrate in the scribe line of the semiconductor wafer between the die by a wide saw blade. A first encapsulant is deposited over the active surface of the semiconductor die and into the channel. A portion of the first encapsulant is removed by a grinding operation to expose the bumps. A portion of the base substrate material is removed from a back surface, opposite the active surface, in a grinding operation to thin the wafer and expose the first encapsulant in the channel. A second encapsulant is deposited over the back surface of the semiconductor die and first encapsulant. The encapsulated semiconductor die are then singulated leaving the first encapsulant on the side surface of the semiconductor die and the second encapsulant on the back surface. The double-encapsulation WLCSP process requires a large inter-die spacing, which can approach the die size, and many processing steps. The large inter-die spacing reduces the die yield per wafer and increases overall manufacturing cost.

In another WLCSP, a single encapsulant is deposited on the back surface and side surfaces of the semiconductor die. The single encapsulation WLCSP process still requires a large inter-die spacing in order to deposit encapsulant on the side surfaces of the semiconductor die. Again, the large inter-die spacing reduces the die yield per wafer and increases overall manufacturing cost.

BRIEF DESCRIPTION OF THE DRAWINGS

FIGS. 2a-2k illustrate a process of packaging a semiconductor die at the wafer-level;

FIGS. 5a-5j illustrate a process of packaging a semiconductor die with backside conductive layer at the wafer-level; and FIGS. 6a-6b illustrate the WLCSP with backside conductive layer post singulation.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
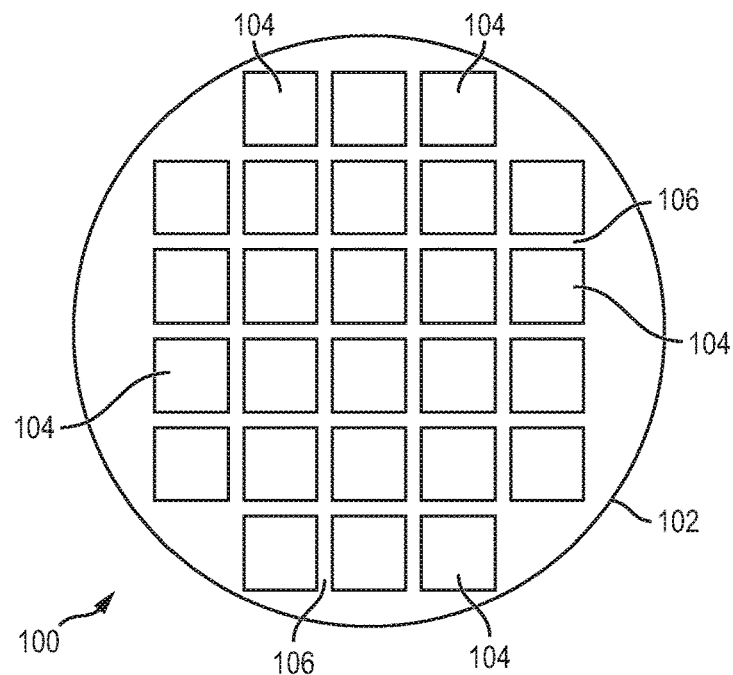
FIGS. 1a-1c illustrate a semiconductor substrate with a plurality of semiconductor die separated by a saw street.

FIG. 1a shows a semiconductor wafer or substrate 100 with a base substrate material 102, such as Si, germanium, AlN, GaAs, GaN, AlGaN/GaN, indium phosphide, SiC, or other bulk material for structural support. Semiconductor substrate 100 has a width or diameter of 100-450 millimeters (mm) and thickness of about 800 micrometers (μm). A plurality of semiconductor die 104 is formed on substrate 100 separated by a non-active, inter-die substrate area or saw street 106. Saw street 106 provides cutting areas to singulate semiconductor substrate 100 into individual semiconductor die 104. In one embodiment, semiconductor die 104 has dimensions of 195 μm by 400 μm, and saw street 106 has a width of 10-20 μm.

Figure 1B:
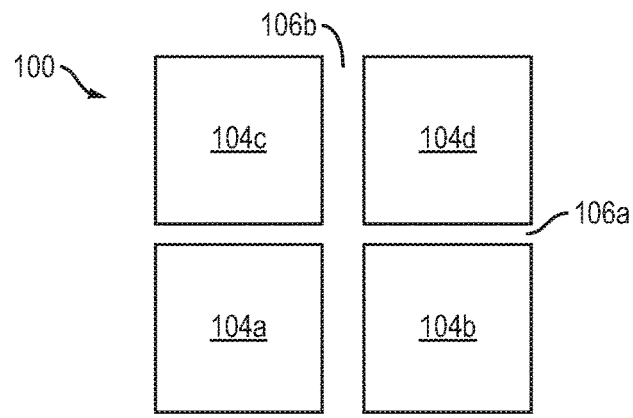

FIG. 1b shows a portion of semiconductor substrate 100. In particular, a width of saw street 106b between semiconductor die 104a and semiconductor die 104b is greater than a width of saw street 106a between semiconductor die 104a and semiconductor die 104c to compensate for non-linear expansion of the dicing tape in the x-direction and y-direction, as described further in FIG. 2g. In one embodiment, the width of saw street 106b is 20 μm and the width of saw street 106a is 10 μm.

Figure 1C:
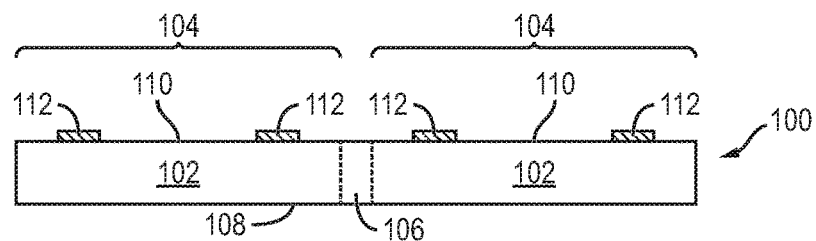

FIG. 1c shows a cross-sectional view of a portion of semiconductor substrate 100. Each semiconductor die 104 includes a back surface 108 and active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits. In one embodiment, semiconductor die 104 implements a diode, transistor, or other discrete semiconductor device. Semiconductor die 104 may also contain a digital signal processor (DSP), microcontroller, ASIC, standard logic, amplifiers, clock management, memory, interface circuit, optoelectronics, and other signal processing circuits. Semiconductor die 104 may also contain integrated passive devices (IPDs), such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as contact pads electrically connected to the circuits, e.g., anode region and cathode region of the diode, on active surface 110.

Figure 2G:
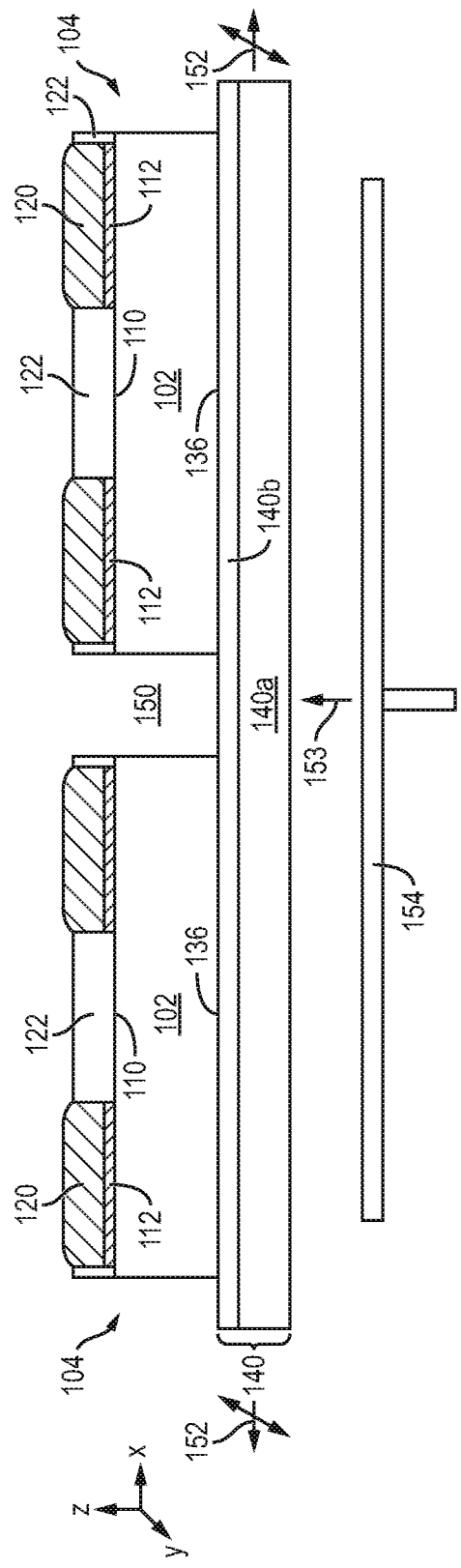

FIGS. 2a-2k show a process of packaging a semiconductor die at the wafer-level. FIG. 2a illustrates a portion of semiconductor substrate 100. An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 120 having a width of 120 µm and height of 20 µm. In some applications, bumps 120 are reflowed a second time to improve electrical contact to conductive layer 112. In one embodiment, bumps 120 are formed over an under bump metallization (UBM) layer. Bumps 120 can also be compression bonded or thermocompression bonded to conductive layer 112. Bumps 120 represent one type of interconnect structure that can be formed over conductive layer 112. The interconnect structure can also use bond wires, conductive paste, stud bump, micro bump, or other electrical interconnect.

In FIG. 2b, a thick insulating layer 122 is formed on active surface 110 between bumps 120 using PVD, CVD, printing, lamination, spin coating, spray coating, sintering, or other process. Insulating layer 122 contains one or more layers of insulating material, such as silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), mold compound, polymer, or other dielectric material having similar structural and insulating properties. Insulating layer 122 substantially fills the gap between bumps 120 over active surface 110. In one embodiment, insulating layer 122 is formed over the entire active surface 110 and surround bumps 120, to provide coverage of active surface 110 where later formed encapsulant may not reach, as described in FIGS. 2b-2k and 3. Alternatively, insulating layer 122 is formed between bumps 120 contacting at least one side of each bump. In this case, the area between bumps 120 and the side surface of semiconductor die 104 remain devoid of insulating layer 122, see FIGS. 4a-4b. Insulating layer 122 can be formed prior to bumps 120, in which case openings are formed in the insulating layer for the bumps.

FIG. 2c shows a plan view of semiconductor substrate 100 with bumps 120 and insulating layer 122 formed over semiconductor die 104. A width of saw street 106b is greater than a width of saw street 106a to compensate for differences, if any, in the expansion of the dicing tape in the x-direction and y-direction. FIG. 2b is a cross-sectional view taken through line 2b-2b in FIG. 2c.

In FIG. 2d, semiconductor substrate 100 with bumps 120 and insulating layer 122 is positioned with the bumps oriented toward backgrinding tape 130. Adhesive layer 132 contacts bumps 120 and insulating layer 122 and secures semiconductor substrate 100 to backgrinding tape 130 while in wafer form. A portion of base substrate material 102 is removed from back surface 108 by grinder 134, leaving planar surface 136, and a 25-200 µm thickness $T_1$ for semiconductor wafer 100.

In FIG. 2e, semiconductor substrate 100 with backgrinding tape 130 is inverted with surface 136 oriented toward dicing tape 140, including expandable polymer base material 140a and expandable adhesive layer 140b. Semiconductor substrate 100 is mounted to adhesive layer 140b of dicing tape 140.

In FIG. 2f, backgrinding tape 130 is removed and semiconductor substrate 100 is singulated through saw street 106 by plasma etching while maintaining relative position of semiconductor die 104. Plasma etching has advantages of forming precision side surfaces along saw streets 106 and different saw street widths on the same wafer, while retaining the structure and integrity of the base substrate material. Alternatively, semiconductor substrate 100 is singulated using a saw blade or laser cutting tool 148. Semiconductor die 104 remain affixed to dicing tape 140 post singulation.

In FIG. 2g, dicing tape 140 is expanded in the x-direction, y-direction, and possibly z-direction to impart movement of semiconductor die 104 to introduce a gap or space 150 and to increase spacing between all adjacent semiconductor die 104. Dicing tape 140 can be expanded in the x-direction, y-direction, and z-direction (see arrows 152, 153) by vertical plunger 154 moving in the z-direction, or an expansion table moving in the x-direction and y-direction. In one embodiment, space 150 between all adjacent semiconductor die 104 has a width of 75 µm or more, see FIG. 2h. The width across all semiconductor die 104 after expansion increases by about 10-30%.

Since dicing tape 140 does not necessarily expand the same in the x-direction and y-direction, the width of saw streets 106a-106b may differ in the x-direction or y-direction between adjacent semiconductor die 104, see FIG. 1b, to compensate for different expansion of the dicing tape in the x-direction and y-direction.

In FIG. 2i, a carrier or temporary substrate 156 contains sacrificial base material, such as overmold tape, polymer, beryllium oxide, silicon, glass, or other suitable low-cost, rigid material for structural support. An interface layer or double-sided tape 158 is formed over carrier 156 as a temporary adhesive bonding film, etch-stop layer, or thermal release layer. Carrier 156 and interface layer 158 is disposed over bumps 120, insulating layer 122, and space 150 for structural support.

In FIG. 2j, semiconductor assembly 160 with spacing 150 between semiconductor die 104, as disposed on carrier 156 and interface layer 158, is inverted and dicing tape 140 is removed. An encapsulant or molding compound 162 is deposited over semiconductor die 104 and into space 150 to cover side surfaces 164 of the semiconductor die using a paste printing, compressive molding, transfer molding, liquid encapsulant molding, vacuum lamination, film-assisted molding, spin coating, or other suitable applicator. Encapsulant 162 can be polymer composite material, such as epoxy resin with filler, epoxy acrylate with filler, or polymer with proper filler. Encapsulant 162 is non-conductive, provides physical support, and environmentally protects the semiconductor device from external elements and contaminants. Encapsulant 162 is deposited after bumps 120 are formed and after space 150 is formed.

In FIG. 2k, semiconductor assembly 160 is again inverted with bumps 120 and insulating layer 122 oriented away from dicing tape 166, including polymer base material 166a and adhesive layer 166b. Semiconductor assembly 160 is mounted to adhesive layer 166b of dicing tape 166. Carrier 156 and interface layer 158 are removed by UV light, chemical etching, mechanical peeling, chemical mechanical planarization (CMP), mechanical grinding, thermal bake, laser scanning, or wet stripping to expose bumps 120 and insulating layer 122. Channels 170 are formed completely through encapsulant 162 and into dicing tape 166 around each semiconductor die 104 using a saw blade or laser cutting tool 172. A portion of encapsulant 162 remains on side surfaces 164 of semiconductor die 104.

Figure 3A:
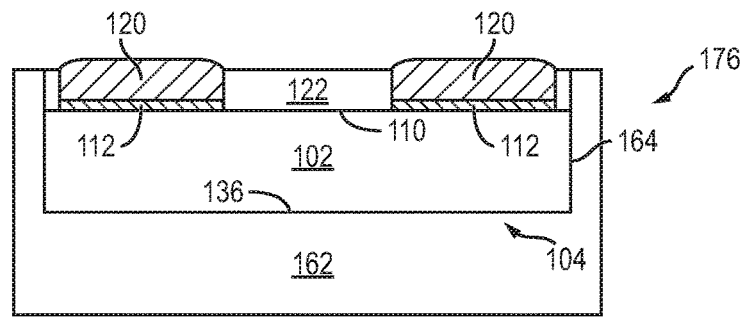
FIGS. 3a-3b illustrate the WLCSP post singulation.
Figure 3B:
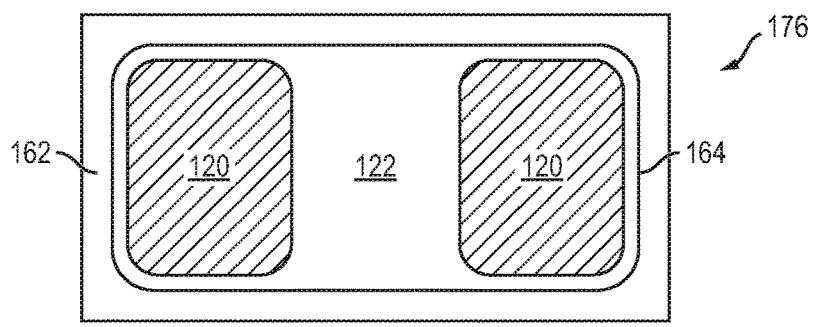

FIG. 3a shows WLCSP 176 post singulation with bumps 120 exposed from insulating layer 122 for external interconnect. Encapsulant 162 covers side surfaces 164 and surface 136 of semiconductor die 104. In one embodiment, WLCSP 176 has dimensions of 235 μm by 440 μm. The WLCSP process described in FIGS. 2a-2k can provide 30-40% more semiconductor die 104 per semiconductor substrate 100 with complete wafer-level packaging, i.e., encapsulation and electrical interconnect of the semiconductor die. WLCSP 176 reduces manufacturing costs and increases die yield per wafer. FIG. 3b is a plan view of WLCSP 176 with bumps 120 exposed from insulating layer 122 and encapsulant 162 covering side surfaces 164 of semiconductor die 104.

Figure 4A:
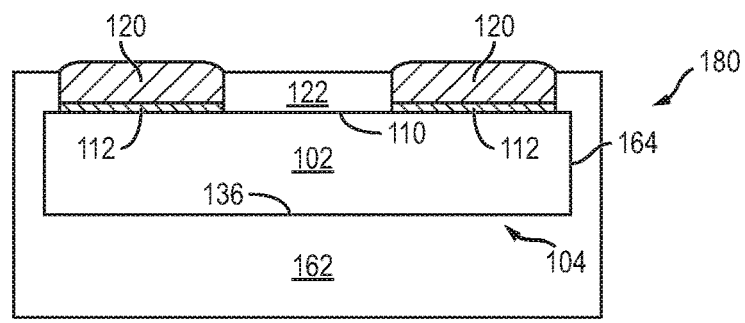
FIGS. 4a-4b illustrate an embodiment of the WLCSP with encapsulant covering a portion of the active surface of the semiconductor die.
Figure 4B:
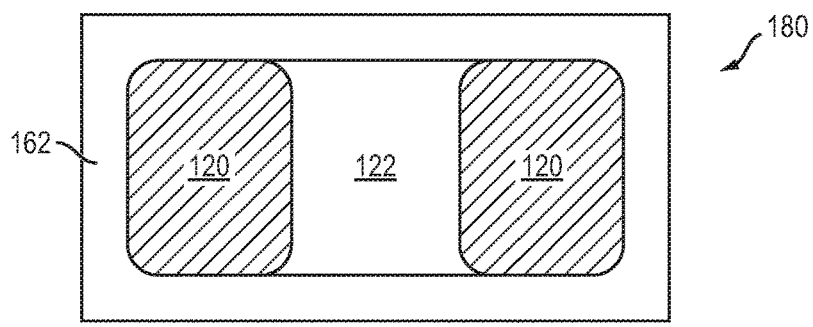

FIG. 4a shows an embodiment of WLCSP 180 with insulating layer 122 formed between bumps 120. In this case, the area between bumps 120 and side surfaces 164 of semiconductor die 104 is devoid of insulating layer 122. With reference to FIG. 2j, encapsulant 162 covers portions of active surface 110 not covered by insulating layer 122, e.g., between bumps 200 and side surfaces 164 of semiconductor die 104. In one embodiment, WLCSP 180 has dimensions of 235 μm by 440 μm. The WLCSP process can provide 30-40% more semiconductor die 104 per semiconductor substrate 100 with complete wafer-level packaging, i.e., encapsulation and electrical interconnect of the semiconductor die. WLCSP 180 reduces manufacturing costs and increases die yield per wafer. FIG. 4b is a plan view of WLCSP 180 with bumps 120 exposed from insulating layer 122 and encapsulant 162 covering side surfaces 164 and a portion of active surface 110 of semiconductor die 104.

FIGS. 5a-5g show a process of packaging a semiconductor die with backside conductive layer at the wafer-level. Continuing from FIG. 2a, a thick insulating layer 182 is formed on active surface 110 between bumps 120 using PVD, CVD, printing, lamination, spin coating, spray coating, sintering or thermal oxidation. Insulating layer 182 contains one or more layers of insulating material, such as SiO2, Si3N4, SiON, Ta2O5, Al2O3, HfO2, BCB, PI, PBO, polymer, or other dielectric material having similar structural and insulating properties. Insulating layer 182 substantially fills the gap between bumps 120 and contacts at least one side of each bump over active surface 110. The area between bumps 120 and the side surface of semiconductor die 104 remains devoid of insulating layer 182.

Figure 5A:
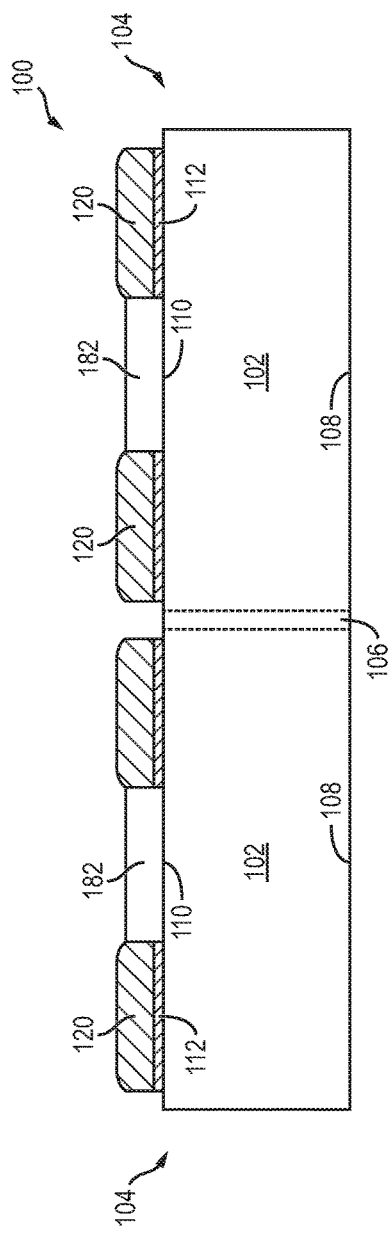
Figure 5B:
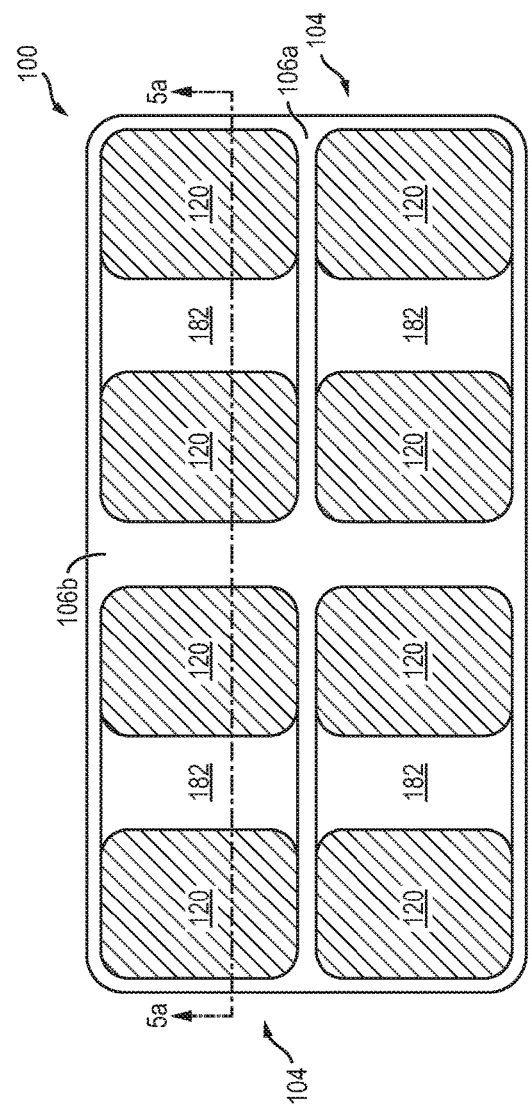

FIG. 5b shows a plan view of semiconductor substrate 100 with bumps 120 and insulating layer 182 formed over semiconductor die 104. A width of saw street 106b is greater than a width of saw street 106a to compensate for any different expansion of the dicing tape in the x-direction and y-direction. FIG. 5a is a cross-sectional view taken through line 5a-5a in FIG. 5b.

Figure 5C:
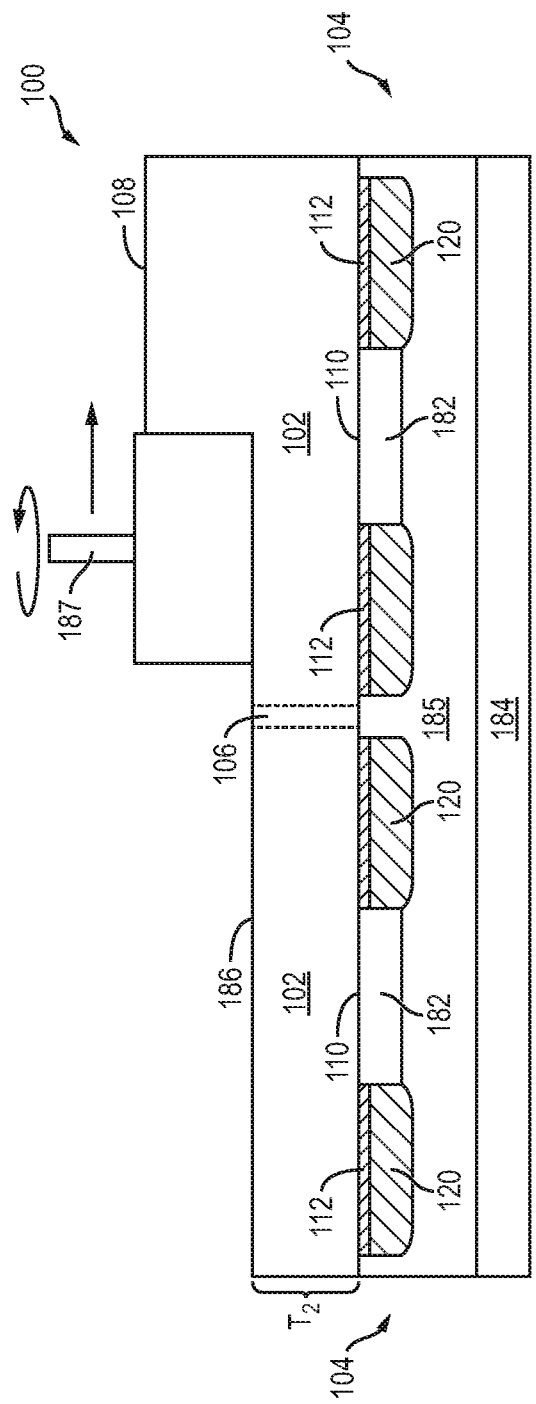

In FIG. 5c, semiconductor substrate 100 with bumps 120 and insulating layer 182 is positioned with the bumps oriented toward backgrinding tape 184. Adhesive layer 185 contacts bumps 120 and insulating layer 182 and secures semiconductor substrate 100 to backgrinding tape 184 while in wafer form. A portion of base substrate material 102 is removed from back surface 108 by grinder 187, leaving planar surface 186, and a 25-300 μm thickness $T_2$ for semiconductor wafer 100.

In FIG. 5d, an electrically conductive layer 188 is formed over surface 186 using PVD, CVD, electrolytic plating, electroless plating process, or other suitable metal deposition process. Conductive layer 188 includes one or more layers of Al, Cu, Sn, Ni, Au, Ag, Ti, TiW, or other suitable electrically conductive material. Conductive layer 188 reduces on-resistance and current density of semiconductor die 104. Alternatively, conductive layer 188 can be patterned to provide increased functionality or to remove material over the saw street.

In FIG. 5e, semiconductor substrate 100 with backgrinding tape 184 is inverted with conductive layer 188 oriented toward dicing tape 190, including expandable polymer base material 190a and expandable adhesive layer 190b. Semiconductor substrate 100 is mounted to adhesive layer 190b of dicing tape 190.

Figure 5F:
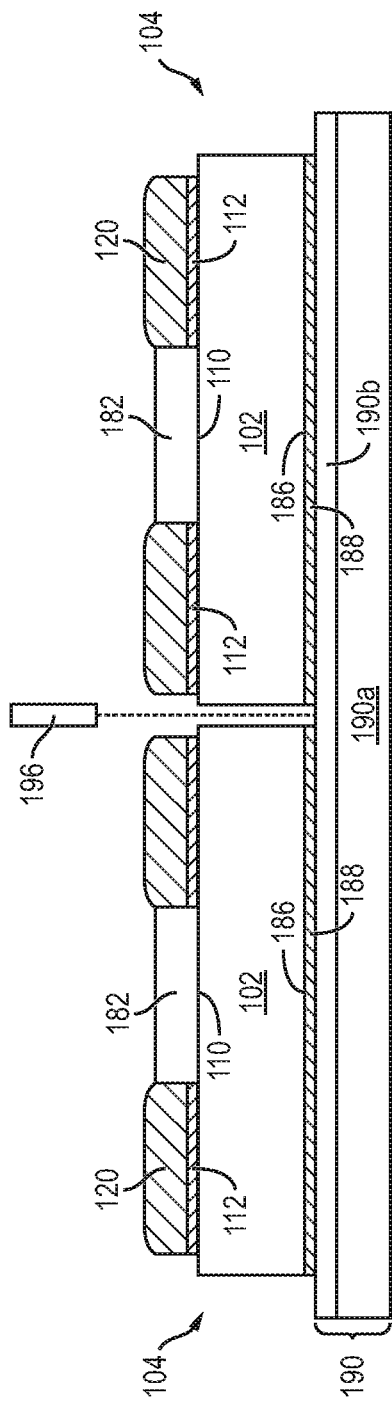

In FIG. 5f, backgrinding tape 184 is removed and semiconductor substrate 100 is singulated through saw street 106 by plasma etching. Plasma etching has advantages of forming precision side surfaces along saw streets 106, while retaining the structure and integrity of the base substrate material. Alternatively, semiconductor substrate 100 is singulated using a saw blade or laser cutting tool 196. A break or cut is made through conductive layer 188 within saw street 106 to permit expansion of dicing tape 190 and movement of semiconductor die 104. Semiconductor die 104 remain affixed to dicing tape 190 post singulation.

Figure 5G:
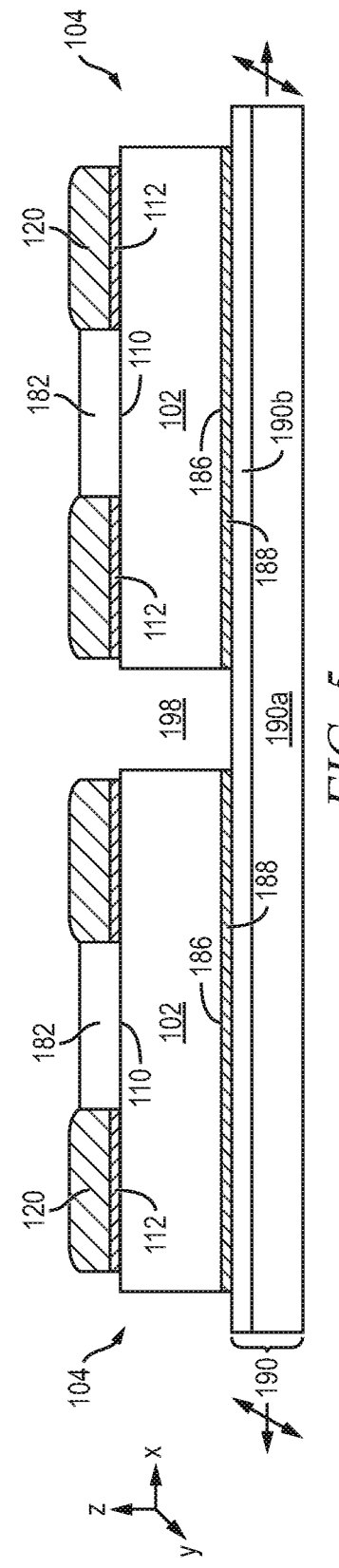

In FIG. 5g, dicing tape 190 is expanded in the x-direction, y-direction, and possibly z-direction to impart movement of semiconductor die 104 to introduce a gap or space 198 and to increase spacing between all adjacent semiconductor die 104. Dicing tape 190 can be expanded by a vertical plunger moving in the z-direction, or an expansion table moving in the x-direction and y-direction, similar to FIG. 2g. In one embodiment, space 198 between all adjacent semiconductor die 104 has a width of 75 μm or more, see FIG. 2h. The width across all semiconductor die 104 after expansion increases by about 10-30%.

Since dicing tape 190 does not necessarily expand the same in the x-direction and y-direction, the width of saw streets 106a-106b may differ between adjacent semiconductor die 104, see FIG. 1b, to compensate for different expansion of the dicing tape in the x-direction and y-direction.

In FIG. 5h, a carrier or temporary substrate 200 contains sacrificial base material, such as overmold tape, polymer, beryllium oxide, silicon, glass, or other suitable low-cost, rigid material for structural support. An interface layer or double-sided tape 202 is formed over carrier 200 as a temporary adhesive bonding film, etch-stop layer, or thermal release layer. Carrier 200 and interface layer 202 is disposed over bumps 120, insulating layer 182, and space 198 for structural support.

In FIG. 5i, semiconductor assembly 210 with spacing 198 between semiconductor die 104, as disposed on carrier 200 and interface layer 202, is inverted and dicing tape 190 is removed. With the dicing tape 190 removed, a process such as water spray, CO2 spray, or other cleaning method can be used to remove any metal 188 remaining between die in opening 198. An encapsulant or molding compound 212 is deposited over semiconductor die 104 and into space 198 to cover side surfaces 214 of the semiconductor die using a paste printing, compressive molding, transfer molding, liquid encapsulant molding, vacuum lamination, film-assisted molding, spin coating, or other suitable applicator. Encapsulant 212 can be polymer composite material, such as epoxy resin with filler, epoxy acrylate with filler, or polymer with proper filler. Encapsulant 212 is non-conductive, provides physical support, and environmentally protects the semiconductor device from external elements and contaminants. Encapsulant 212 is deposited after bumps 120 are formed and after space 198 is formed.

In FIG. 5*j*, semiconductor assembly 210 is again inverted with bumps 120 and insulating layer 182 oriented away from dicing tape 216, including polymer base material 216*a* and adhesive layer 216*b*. Semiconductor assembly 210 is mounted to adhesive layer 216*b* of dicing tape 216. Carrier 200 and interface layer 202 are removed by UV light, chemical etching, mechanical peeling, CMP, mechanical grinding, thermal bake, laser scanning, or wet stripping to expose bumps 120 and insulating layer 122. Channels 220 are formed completely through encapsulant 212 and into dicing tape 216 around each semiconductor die 104 using a saw blade or laser cutting tool 222. A portion of encapsulant 212 remains on side surfaces 214 of semiconductor die 104.

FIG. 6*a* shows WLCSP 226 post singulation with bumps 120 exposed from insulating layer 182 for external interconnect. Encapsulant 212 covering side surfaces 214, conductive layer 188, and surface 186 of semiconductor die 104. In one embodiment, WLCSP 226 has dimensions of 235 μm by 440 μm. The WLCSP process described in FIGS. 5*a*-5*j* can provide 30-40% more semiconductor die 104 per semiconductor substrate 100 and still provides complete wafer-level packaging, i.e., encapsulation and electrical interconnect of the semiconductor die. WLCSP 226 reduces manufacturing costs and increases die yield per wafer. FIG. 6*b* is a plan view of WLCSP 226 with bumps 120 exposed from insulating layer 182 and encapsulant 212 covering side surfaces 214 and a portion of active surface 110 of semiconductor die 104.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
   providing a semiconductor substrate including a plurality of semiconductor die with saw streets of different widths to create asymmetrical spacing between the semiconductor die;
   forming a plurality of bumps over a first surface of the semiconductor die;
   forming an insulating layer over the first surface of the semiconductor die between the bumps;
   disposing the semiconductor substrate on a dicing tape;
   singulating the semiconductor substrate through the saw streets while maintaining position of the semiconductor die on the dicing tape;
   expanding the dicing tape to impart movement of the semiconductor die and increase spacing between the semiconductor die, wherein the different widths of the saw streets are selected to compensate for non-linear expansion of the dicing tape;
   depositing an encapsulant over the semiconductor die and into the space between the semiconductor die; and
   forming a channel through the encapsulant between the semiconductor die to separate the semiconductor die.

2. The method of claim 1, further including forming the insulating layer over the first surface of the semiconductor die and around the bumps.

3. The method of claim 1, further including depositing the encapsulant over a portion of the first surface of the semiconductor die.

4. The method of claim 1, further including removing a portion of a second surface of the semiconductor die opposite the first surface of the semiconductor die.

5. The method of claim 1, further including forming a conductive layer over a second surface of the semiconductor die opposite the first surface of the semiconductor die.

6. The method of claim 1, further including:
   disposing the semiconductor substrate over a dicing tape; and
   expanding the dicing tape to impart movement of the semiconductor die to increase the space between the semiconductor die.

7. The method of claim 1, wherein a first distance between a first semiconductor die and an adjacent second semiconductor die on the semiconductor substrate is greater than a second distance between the first semiconductor die and an adjacent third semiconductor die on the semiconductor substrate.

8. A method of making a semiconductor device, comprising:
   providing a first carrier;
   disposing a semiconductor substrate including a plurality of semiconductor die on the first carrier;
   forming a plurality of bumps over a first surface of the semiconductor die;
   forming an insulating layer over the first surface of the semiconductor die between the bumps;
   singulating the semiconductor substrate between the semiconductor die while maintaining position of the semiconductor die on the first carrier;
   expanding a space between the semiconductor die on the first carrier;
   disposing the semiconductor die onto a second carrier with the bumps oriented toward the second carrier while maintaining the expanded space on the first carrier;
   removing the first carrier;
   depositing an encapsulant over the semiconductor die and into the space between the semiconductor on the second carrier; and
   forming a channel through the encapsulant between the semiconductor die to separate the semiconductor die.

9. The method of claim 8, further including forming the insulating layer over the first surface of the semiconductor die and around the bumps.

10. The method of claim 8, further including depositing the encapsulant over a portion of the first surface of the semiconductor die.

11. The method of claim 8, further including removing a portion of a second surface of the semiconductor die opposite the first surface of the semiconductor die.

12. The method of claim 8, further including forming a conductive layer over a second surface of the semiconductor die opposite the first surface of the semiconductor die.

13. The method of claim 8, further including:
disposing the semiconductor substrate over a dicing tape; and
expanding the dicing tape to expand the space between the semiconductor die.

14. The method of claim 8, wherein a first distance between a first semiconductor die and an adjacent second semiconductor die on the semiconductor substrate is greater than a second distance between the first semiconductor die and an adjacent third semiconductor die on the semiconductor substrate.

15. A method of making a semiconductor device, comprising:
providing a plurality of semiconductor die with asymmetrical spacing between the semiconductor die;
forming a plurality of bumps over a first surface of the semiconductor die;
forming an insulating layer over the first surface of the semiconductor die between the bumps;
disposing the semiconductor die on a dicing tape;
expanding the dicing tape to impart movement of the semiconductor die and increase spacing between the semiconductor die, wherein the asymmetrical spacing between the semiconductor die compensates for non-linear expansion of the dicing tape;
depositing an encapsulant over the semiconductor die and into the space between the semiconductor die; and
forming a channel through the encapsulant between the semiconductor die.

16. The method of claim 15, further including depositing the encapsulant over a portion of the first surface of the semiconductor die.

17. The method of claim 15, further including forming a conductive layer over a second surface of the semiconductor die opposite the first surface of the semiconductor die.

18. The method of claim 15, wherein the space between the semiconductor die is at least 75 micrometers.

19. The method of claim 15, wherein the semiconductor die includes a discrete semiconductor device.

* * * * *